United States Patent [19]

Yasuzato et al.

[11] Patent Number: 5,750,290
[45] Date of Patent: May 12, 1998

[54] PHOTO MASK AND FABRICATION PROCESS THEREFOR

[75] Inventors: Tadao Yasuzato; Shinji Ishida, both of Tokyo, Japan

[73] Assignee: NEC Corporation, Tokyo, Japan

[21] Appl. No.: 634,983

[22] Filed: Apr. 19, 1996

[30] Foreign Application Priority Data

Apr. 20, 1995 [JP] Japan .................................. 7-095087

[51] Int. Cl.⁶ .................................................. G03L 9/00
[52] U.S. Cl. ..................................... 430/5; 430/322
[58] Field of Search ............................. 430/5, 321, 322; 378/34, 35

[56] References Cited

U.S. PATENT DOCUMENTS 5,521,031  5/1996  Tennant et al. ......................... 430/5
5,549,994  8/1996  Watanabe et al. ....................... 430/5

FOREIGN PATENT DOCUMENTS 62-37383  8/1987  Japan.
4-162039  6/1992  Japan.

Primary Examiner—S. Rosasco
Attorney, Agent, or Firm—Sughrue, Mion, Zinn, Macpeak & Seas, PLLC

[57] ABSTRACT

After forming a light shielding layer 2 of ruthenium in a thickness of 70 nm and a reflection preventing layer 3 of a ruthenium oxide in thickness of 30 nm, and a photosensitive resin layer, a sililated layer is formed by electron beam lithography and sililation. Etching is performed for the photosensitive resin layer, and the reflection preventing layer and the light shielding layer are dry etched using oxygen gas with taking the sililated layer as a mask. By this, dimensional precision of a pattern of a photo mask can be improved.

33 Claims, 8 Drawing Sheets

PHOTO MASK AND FABRICATION PROCESS THEREFOR

BACKGROUND OF THE INVENTION

1. Field of the Invention

The present invention relates to a photo mask for projection exposure apparatus. More specifically, the invention relates to a photo mask for fabrication of a semiconductor device, which requires formation of a fine pattern, and fabrication process therefor.

2. Description of the Related Art

In fabrication process of semiconductor devices, photolithographic technology is employed for forming a pattern on a semiconductor substrate. In the photolithography, a photo mask pattern is transferred on a photosensitive resin which is applied on the semiconductor substrate, by a contacting projection exposure apparatus, and the desired pattern of the photosensitive resin is thus obtained through development.

Photo mask is a negative plate for projection exposure, which is formed by depositing a light shielding layer on a transparent substrate and forming transparent region and light shielding region by partially removing the light shielding layer. On the other hand, demagnification rate (size of pattern on the photo mask and size of the formed image) of the projection exposure apparatus is not 1:1. The negative plate of the demagnification projection exposure is specifically referred to as reticle. However, in this specification, it is also referred to as photo mask.

As a material of the transparent substrate of the photo mask, synthetic quartz having high transparency and having small dimensional variation (deflection due to its own weight or deviation due to thermal expansion) is suitable. However, since the synthetic quartz is high in the cost, other material, such as soda glass or so forth, is used for an application not requiring high precision.

On the other hand, as a material of the light shielding layer on the transparent substrate, conductivity and workability (facility for etching) is required. Necessity of conductivity is caused by most frequent employment of an electron beam lithography system as a pattern lithography system of the photo mask. On the other hand, demagnification rate of the demagnifying projection exposure system is generally 5:1. For example, even for the pattern of the semiconductor device of 0.4 μm, the pattern on the photo mask becomes 2 μm. Therefore, for processing of light shielding layer, wet etching has been employed. As a material having conductivity and workability in wet etching, chromium (Cr) can be considered. Also, chromium has high chemical resistance, is easy to wash, and thus is used as light shielding material of the photo mask.

A section of a typical conventional photo mask is shown in FIG. 1. On a transparent substrate 1 of quartz and so forth, a light shielding layer 12 formed of chromium and a reflection preventing layer 13 formed of chromium oxide are deposited. The thickness of the light shielding layer 12 is set at 60 to 70 nm in order to shield the light to have lower than or equal to 1% of transparency of exposure light. On the other hand, the reflection preventing layer prevents the light reflected from the semiconductor substrate as the article to be exposed to be reflected by the photo mask through a projection lens to return to the semiconductor substrate. The thickness of the reflection preventing layer is in the extent of 30 nm in the case where mercury i-line is used as the exposure light. In such photo mask, since reflection is prevented by mutual cancellation of the reflection of the surface of the reflection preventing layer and reflection at the interface between the reflection preventing layer and the light shielding layer, the optimal layer thickness of the reflection preventing layer is differentiated depending upon the exposure light to be used.

In the recent years, when the semiconductor device pattern becomes smaller than 0.4 μm and thus the mask pattern becomes smaller than or equal to 2 μm, a problem is encountered in dimensional precision in processing by way of wet etching. Therefore, study has been made for process employing dry etching. However, chromium cannot be etched unless a gas containing chloride (e.g. past used $CCl_4$, $BCl_3$ or $Cl_2$ is used). The electron beam resist has no property to be patterned into rectangular or square shape in forming resist pattern and has low dry etching resistance to cause thinning of the resist pattern during dry etching employing chlorine gas to lower dimensional precision to be lower than that obtained by wet etching.

Namely, in the conventional photo mask shown in FIG. 1, since the chromium is employed as the light shielding layer, the problem of difficulty of dry etching is caused. In the etching by chlorine gas, the pattern dimension is varied due to thinning of the resist layer during etching to make it impossible to achieve satisfactory dimensional precision. When a metal which can be etched by the gas containing fluorine and silicide, a problem is encountered that the transparent substrate may also be etched during etching by the fluorine gas. Namely, the surface of the transparent substrate can be roughen to cause local variation of the transparency.

Therefore, as disclosed in Japanese Examined Patent Publication (Kokoku) No. Showa 62-37383, study has been made for metal layer which can be dry-etched by the fluorine gas (e.g. $CF_4$, $CHF_3$) in place of chromium. In dry etching employing the fluorine gas, since etching rate ratio (selection ratio) between the metal layer and the photosensitive resin (resist) can be set large, dimensional precision can be enhanced by restricting thinning of the layer of the resist during dry etching. In Japanese Examined Patent Publication No. Showa 62-37383, selene, germanium, iridium, vanadium and ruthenium are listed as material of the light shielding layer in place of the chromium. Also, refractory metal silicide, such as tungsten silicide (WSi) and molybdenum silicide (MoSi) and so forth may be employed as the light shielding layer which can be processed by the fluorine gas.

Next, discussion will be given for phase shift mask which is recently drawing attention in the photo mask technology.

In the conventional photo lithographic technology, adaption to increased density of the semiconductor device pattern is achieved by increasing of nominal aperture of the exposure apparatus. While resolution can be improved by increasing of nominal aperture of the exposure apparatus, focal depth is conversely decreased to make it impossible to achieve further higher package density in the light of the focal depth. Therefore, proposal for phase shift mask proposed on 1982 draws attention again. In general, the phase shift mask is a technology for improving light intensity distribution on a image forming surface by controlling phase of the exposure light passing through the photo mask.

FIG. 2 illustrates one of typical phase shift mask called as Shibuya-Levenson system. A transparent layer 18 of SOG layer is formed at a part of photo mask having the light shielding layer 12 of chromium and the reflection preventing layer 13 of chromium oxide.

The mask of this system is specifically employed in a repeated pattern, such as line and space and is the phase shift mask providing phase shift of 180° for light beam passing through adjacent transparent regions on the photo mask and is not suitable for independent pattern. Since wavelength is variable depending upon refraction index of substance transmitting light, the thickness t of the transparent layer called as phase shifter is set to be t=λ/2 (n−1) (wherein λ is a wavelength of the exposure light, n is a refraction index of transparent layer) to provide phase shift of 180° between the light past through the phase shifter and the light not past through the phase shifter by path difference. Normally, material of the phase shifter is SOG (spin on glass) layer or $SiO_2$ layer formed by sputtering method or CVD method. On the other hand, the phase shifter is processed by dry etching employing fluorine gas. However, since the quartz as the transparent substrate 1 is also etched in conjunction therewith, an etching stopper 10 on the transparent substrate is required. The etching stopper 10 is formed of metal oxide having transparency, such as ITO (indium tin oxide) alumina ($Al_2O_3$), tin oxide ($SnO_2$). For example, in case of SOG layer, any of the above-listed metal oxides may achieve about 10 of selection ratio.

On the other hand, with respect to the independent pattern, such as contact hole, attention is attracted to a half-tone type phase shift mask (as disclosed in Japanese Unexamined Patent Publication (Kokai) No. Heisei 4-162039. FIG. 3 shows a section of the half-tone type phase shift mask. 120 nm in length of a semi-transparent layer 17 of oxi-nitride chromium is formed on the transparent substrate 1. This semi-transparent layer 17 of oxi-nitride chromium passes approximately 10% of light, and in conjunction therewith, provides 180° of phase shift between the light passing therethrough and the light not passing therethrough. As the material for the semi-transparent layer 17 for such half-tone type phase shift mask, chromium type, such as chromium oxide (CrO), chromium nitride (CrN) or oxi-nitride chromium (CrON) or molybdenum type, such as molybdenum silicide oxide (MoSiO), oxi-nitride molybdenum silicide (MoSiON) are typically employed.

However, in the conventional half-tone phase shift type photo mask shown in FIG. 3, oxi-nitride chromium is employed as the semi-transparent layer, a problem is encountered in that variation of the pattern dimension during dry etching with employing the chlorine gas, is unacceptably large. In other half-tone type photo mask, since the metal which can be etched with the gas containing fluorine is employed as the semi-transparent material, the transparent substrate is etched by the fluorine gas. Particularly, in the phase shift mask, etching of the transparent substrate should cause phase error (offset from a target value of the phase difference) resulting in degradation of resolution. On the other hand, in case of the half-tone type, even when the etching stopper as employed in the Shibuya-Levenson type phase shift mask, satisfactory selection ratio between the semi-transparent layer (oxi-nitride) and the etching stopper (metal oxide) cannot be achieved, and this is not a solution for phase error.

SUMMARY OF THE INVENTION

It is an object of the present invention to provide a photo mask which has a light shielding layer achieving satisfactorily high dimensional precision by dry etching and a transparent substrate will never be etched, and fabrication process therefor.

Another object of the present invention is to provide a phase shift type photo mask which has semi-transparent layer achieving satisfactorily high precision and a transparent substrate will never be etched, and fabrication process therefor.

A first photo mask according to present invention comprises:

a transparent substrate;

a light shielding layer of ruthenium formed on said transparent substrate; and a reflection preventing layer of ruthenium oxide formed on said light shielding layer.

A second photo mask according to the present invention comprises:

a transparent substrate;

a light shielding layer of ruthenium formed on said transparent substrate; and a reflection preventing layer of one kind of material selected from a group consisted of chromium oxide, chromium nitride and oxi-nitride-chromium, formed on the light shielding layer.

A third photo mask according to the present invention comprises:

a transparent substrate;

a light shielding layer of ruthenium formed on said transparent substrate; and a reflection preventing layer of one kind of material selected from a group consisted of oxide, nitride and oxi-nitride of refractory metal silicide, formed on said light shielding layer.

A fourth half-tone type photo mask according to the present invention comprises:

a transparent substrate; and a semi-transparent layer of at least one kind of material selected from a group consisted of ruthenium, ruthenium oxide, ruthenium nitride and oxi-nitride-ruthenium, formed on said transparent substrate, phases being shifted for 180° between an exposure light passing through said semi-transparent layer and an exposure light not passing through said semi-transparent layer.

A fifth half-tone type photo mask according to the present invention comprises:

a transparent substrate; and a stacked layer consisted of a semi-transparent layer formed of at least one kind of material selected from a group consisted of ruthenium, ruthenium oxide, ruthenium nitride and oxi-nitride-ruthenium, and a transparent layer of one kind of material selected from a group consisted of silicon oxide, a silicon nitride and oxi-nitride-silicon;

a transparent region being patterned in said transparent substrate defined by said semi-transparent region, and phases being shifted for 180° between a light passing through said transparent region and a light passing through said semi-transparent region.

A sixth half-tone type photo mask according to the present invention comprises:

a transparent substrate; and a semi-transparent region having a first transparent layer of material selected from a group consisted of ruthenium, ruthenium oxide, ruthenium nitride and oxi-nitride-ruthenium, and a second semi-transparent layer of any one material selected from a group consisted of chromium oxide, chromium nitride and oxi-nitride-chromium formed on said first semi-transparent layer, a transparent region being patterned in said transparent substrate defined by said semi-transparent region, and phases being shifted for 180° between a light passing through said transparent region and a light passing through said semi-transparent region.

A seventh photo mask according to the present invention comprises a transparent substrate;

a semi-transparent region having a first semi-transparent layer of material selected from a group consisted of ruthenium, ruthenium oxide, ruthenium nitride and oxi-nitride-ruthenium, and a second semi-transparent layer of any one material selected from a group consisted of oxide, nitride and oxi-nitride of refractory metal silicide, a transparent region being patterned in said transparent substrate defined by said semi-transparent region, and phases being shifted for 180° between a light passing through said transparent region and a light passing through said semi-transparent region.

A first fabrication process of a photo mask according to the present invention comprises the steps of:

forming a mask blank by sequentially forming a light shielding layer of ruthenium and a reflection preventing layer of ruthenium oxide on a transparent substrate;

forming a sililated layer by applying a photosensitive resin on said mask blank and performing sililation process after electron beam or ultra violet beam lithography; and performing etching of said photosensitive resin layer, said reflection preventing layer and said light shielding layer by dry etching employing an oxygen gas with taking said sililated layer as a mask.

A second fabrication process of a photo mask according to the present invention comprises the steps of:

forming a mask blank by sequentially forming a light shielding layer of ruthenium and a reflection preventing layer of one kind of material selected from a group consisted of chromium oxide, chromium nitride and oxi-nitride-chromium, on a transparent substrate;

applying a photosensitive resin on said mask blank and developing said photosensitive resin after electron beam or ultra violet beam lithography, thereby patterning said photosensitive resin layer; and performing etching of said reflection preventing layer by dry etching employing a gas containing chloride with taking said photosensitive resin layer as a mask and subsequently performing etching of said light shielding layer by dry etching employing an oxygen gas.

A third fabrication process of a photo mask according to the present invention comprises the steps of:

forming a mask blank by sequentially forming a light shielding layer of ruthenium and a reflection preventing layer of one kind of material selected from a group consisted of oxide, nitride and oxi-nitride of refractory metal silicide on a transparent substrate;

applying a photosensitive resin on said mask blank and developing said photosensitive resin layer after electron beam or ultra violet beam lithography, thereby patterning said photosensitive resin layer; and performing etching of said reflection preventing layer by dry etching employing a gas containing fluorine with taking said photosensitive resin layer as a mask and subsequently performing etching of said light shielding layer by dry etching employing an oxygen gas.

A fourth fabrication process of a photo mask on a transparent substrate according to the present invention comprises the steps of:

forming a mask blank formed of a semi-transparent layer formed of at least one kind of material selected from a group consisted of ruthenium, ruthenium oxide, ruthenium nitride and oxi-nitride-ruthenium;

forming a sililated layer by applying a photosensitive resin on said mask blank and performing sililation process after electron beam or ultra violet beam lithography; and performing etching of said photosensitive layer and said reflection preventing layer by dry etching employing an oxygen gas with taking said sililated layer as a mask.

A fifth fabrication process of half-tone type photo mask according to the present invention comprises the steps of:

forming a semi-transparent layer formed of at least one kind of material selected from a group consisted of ruthenium, ruthenium oxide, ruthenium nitride and oxi-nitride-ruthenium, on a transparent substrate;

forming a mask blank formed of a transparent layer of one kind of material selected from a group consisted of silicon oxide, a silicon nitride and oxi-nitride-silicon, on said semi-transparent layer;

patterning a photosensitive resin layer by applying said photosensitive resin on said mask blank, and performing electron beam or ultraviolet beam lithography and development on said photosensitive resin;

performing dry etching of said transparent layer employing a fluorine gas with taking said photosensitive resin layer as a mask and performing dry etching of said semi-transparent layer employing an oxygen gas.

A sixth fabrication process of a half-tone type photo mask according to the present invention comprises the steps of:

forming a mask blank by forming a first semi-transparent layer of material selected from a group consisted of ruthenium, ruthenium oxide, ruthenium nitride and oxi-nitride-ruthenium, and a second semi-transparent layer of any one material selected from a group consisted of chromium oxide, chromium nitride and oxi-nitride-chromium, on a transparent substrate, patterning a photosensitive resin layer by applying said photosensitive resin layer on said mask blank and performing electron beam on ultraviolet beam lithography and development on said photosensitive resin layer;

performing dry etching of said second semi-transparent layer employing a gas containing chloride with taking said photosensitive resin layer as a mask and performing dry etching of said first semi-transparent layer employing an oxygen gas.

A seventh fabrication process of a photo mask according to the present invention comprises the steps of:

forming a mask blank by forming a first semi-transparent layer of material selected from a group consisted of ruthenium, ruthenium oxide, ruthenium nitride and oxi-nitride-ruthenium, and a second semi-transparent layer of any one selected from a group consisted of oxide, nitride and oxi-nitride of refractory metal silicide, patterning a photosensitive resin layer by applying said photosensitive resin layer on said mask blank and performing electron beam or ultraviolet beam lithography and development on said photosensitive resin layer;

performing dry etching of said second semi-transparent layer employing a gas containing fluorine with taking said photosensitive resin layer as a mask and performing dry etching of said first semi-transparent layer employing an oxygen gas.

The photo mask of the present invention constructed as set forth above can etch the light shielding layer and the reflection preventing layer together with pattering of the photosensitive resin layer by employing ruthernium and oxi-nitride of ruthernium as material of the light shielding layer and the reflection preventing layer and taking a sililated layer as a mask. Thus, enhancement of the dimensional precision can be achieved.

On the other hand, by employing ruthenium as the light shielding layer and by employing a substance which enables etching with chlorine gas or fluoride gas, the dimensional precision level can be enhanced. Also, the transparent substrate can be prevented from being damaged. Namely, after etching of quite thin reflection preventing layer, etching is performed with oxygen to enable improvement of the dimensional precision without affecting for the transparent substrate and the reflection preventing layer.

Furthermore, by employing ruthernium and its oxi-nitride layer as a semi-transparent layer, the photo mask of the phase shift type with high precision and without no phase error can be obtained.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The preferred embodiments of the present invention will be discussed hereinafter with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to not unnecessarily obscure the present invention.

FIGS. 4A to 4D are sections of a substrate for discussing the first embodiment of the present invention.

Figure 4A:
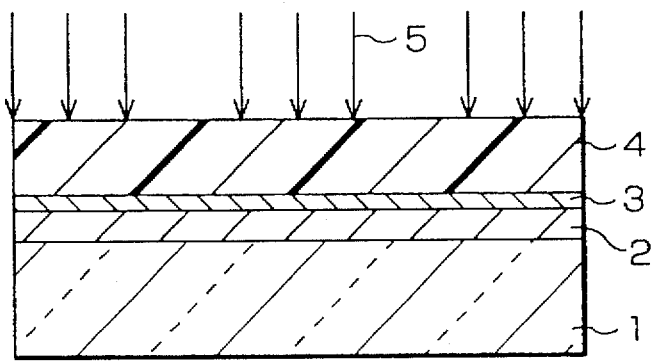
FIGS. 4A to 4D are sections showing a substrate for explaining the first embodiment according to the present invention.

At first, as shown in FIG. 4A, a light shielding layer 2 of 700 nm in thickness of ruthenium is deposited on a transparent substrate 1 of quartz by sputtering method. Subsequently, by supply oxygen gas into sputter, a reflection preventing layer 3 of 30 nm in thickness of ruthenium oxide is deposited. Subsequently, over the entire surface, a photosensitive resin layer 4 is applied. Then, a predetermined pattern is written by a writing method employing an electron beam 5.

Figure 4B:
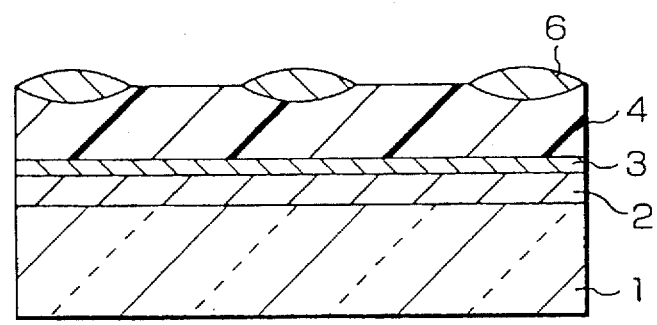

Next, as shown in FIG. 4B, a sililated layer 6 is formed by supplying silicon into the surface of the written photosensitive resin layer 4 by a sililation method performing baking at 180° C. under hexamethyldisilazane (HMDS) for 3 minutes.

Figure 4C:
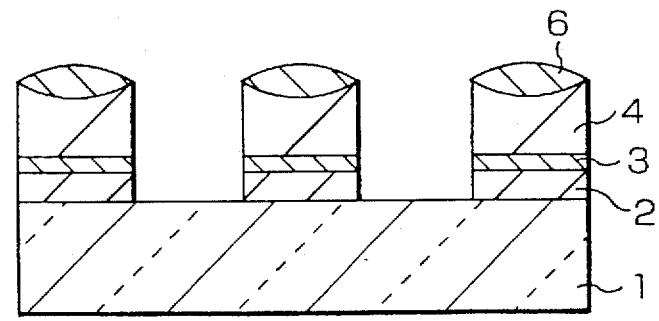

Then, as shown in FIG. 4C, with employing a parallel plate reactive ion etching (RIE) dry etching system, the photosensitive resin layer 4 at the non-exposed portion is etched with taking the sililated layer 6 as mask by oxygen dry etching under a condition of 20 sccm of oxygen flow rate, 100 nW of power and 20 mTorr of pressure. Subsequently, the reflection preventing layer 3 of ruthenium oxide and the light shielding layer 2 of ruthenium are etched.

Figure 4D:
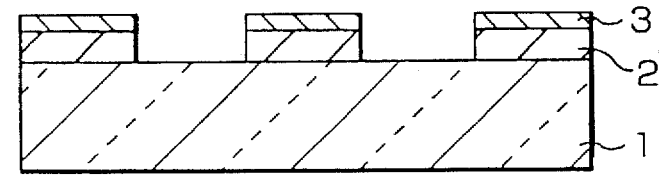

Then, finally, as shown in FIG. 4D, photo mask is completed by removing the photosensitive resin layer 4 by acid washing (sulfuric acid hydrogen peroxide:100° C.).

It should be noted that, in dry etching by oxygen of ruthenium oxide and ruthenium, the ruthenium oxide and ruthenium can be processed at equivalent precision to the pattern of the photosensitive resin layer, and the transparent substrate is not influenced. Namely, in the photo mask employing the conventional reflection preventing layer 13 of chromium oxide and the light shielding layer 12 of chromium, side etching is caused in the photosensitive resin layer upon etching by chlorine gas to gradually reduce dimension to make it difficult to obtain sufficient processing precision. On the other hand, in the conventional photo mask employing the reflection preventing layer of oxide of refractory metal silicide and the light shielding layer of refractory metal silicide, the surface of the transparent substrate is damaged by etching with fluorine gas to cause lowering of transparency. However, in the oxygen dry etching of the first embodiment, a little side etching is caused in the ruthenium oxide and ruthenium and quartz as the transparent substrate is never etched.

Figure 5A:
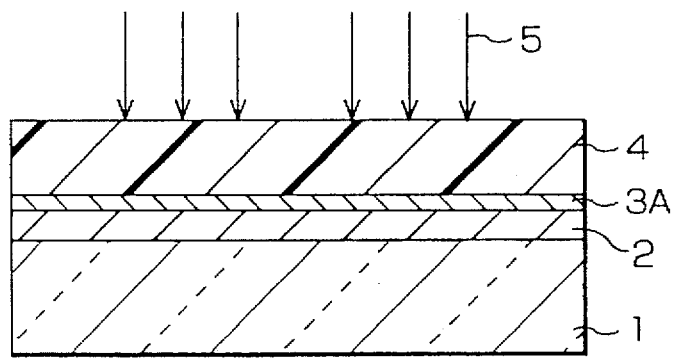
FIGS. 5A to 5D are sections showing a substrate for explaining the second embodiment according to the present invention.

FIGS. 5A to 5D are sections of a substrate for discussing the second embodiment of the present invention. At first, as shown in FIG. 5A, the light shielding layer 2 of 700 nm in thickness of ruthenium is deposited on a transparent substrate 1 of quartz by sputtering method. Subsequently, by changing a target of sputtering and performing sputtering with supplying oxygen gas, a reflection preventing layer 3A of 30 nm in thickness of chromium oxide is deposited. Subsequently, over the entire surface, the photosensitive resin layer 4 is applied. Then, a predetermined pattern is written by a writing method employing an electron beam 5.

Figure 5B:
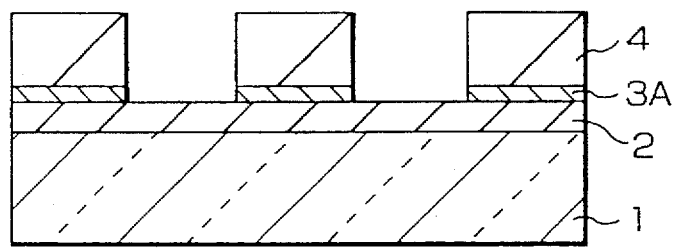

Next, as shown in FIG. 5B, after forming the pattern of the photosensitive resin layer 4 by development, the reflection preventing layer 3A of the chromium oxide is etched by dry etching using chlorine gas.

Figure 5C:
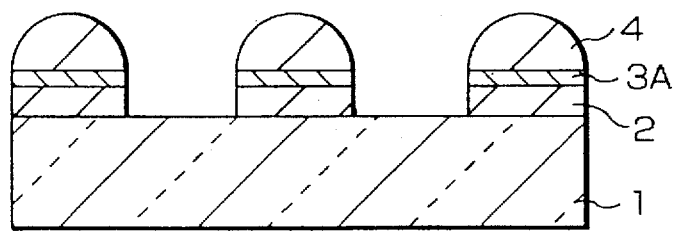

Then, as shown in FIG. 5C, the light shielding layer 2 of ruthenium is etched by oxygen dry etching.

Figure 5D:
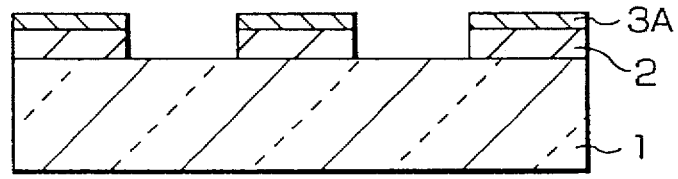

Then, finally, as shown in FIG. 5D, photo mask is completed by removing the photosensitive resin layer 4 by acid washing.

In the second embodiment, since the layer to be etched by the chlorine gas is the quite thin reflection preventing layer 3A having thickness of 30 nm, reducing of dimension of the photosensitive resin layer during etching can be significantly improved. Also, upon dry etching of the light shielding layer 2 of ruthenium employing oxygen gas, the reflection preventing layer 3A of chromium oxide is never etched and thus can completely serve as etching mask. Thus the mask achieving higher dimensional precision than that in the prior art can be obtained easily.

FIGS. 6A to 6D are sections of a substrate for discussing the third embodiment of the present invention. At first, as shown in FIG. 5A, the light shielding layer 2 of 700 nm in thickness of ruthenium is deposited on a transparent substrate 1 of quartz by sputtering method. Subsequently, by changing a target of sputtering and performing sputtering with supplying oxygen gas, a reflection preventing layer 3B of 30 nm in thickness of oxide of molybdenum silicide is deposited. Subsequently, over the entire surface, the photosensitive resin layer 4 is applied. Then, a predetermined pattern is written by a writing method employing an electron beam 5.

Figure 6A:
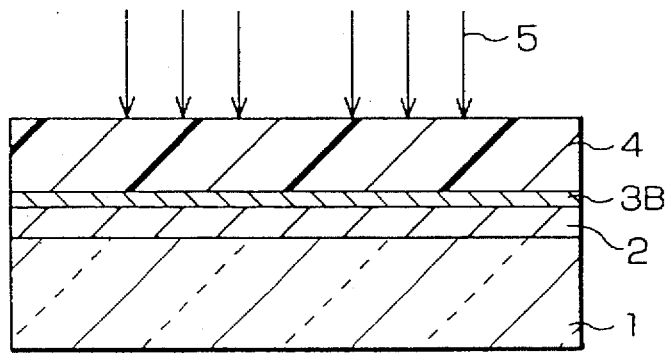
FIGS. 6A to 6D are sections showing a substrate for explaining the third embodiment according to the present invention.
Figure 6B:
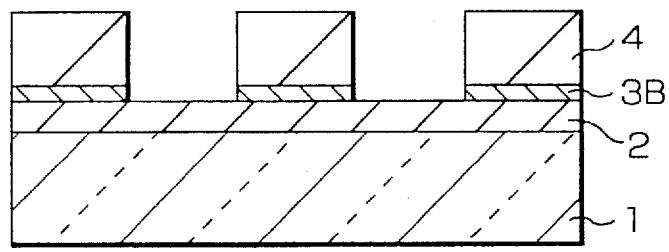

Next, as shown in FIG. 6B, after forming the pattern of the photosensitive resin layer 4 by development, the reflection preventing layer 3B of the oxide of molybdenum silicide is etched by dry etching with fluorine gas.

Figure 6C:
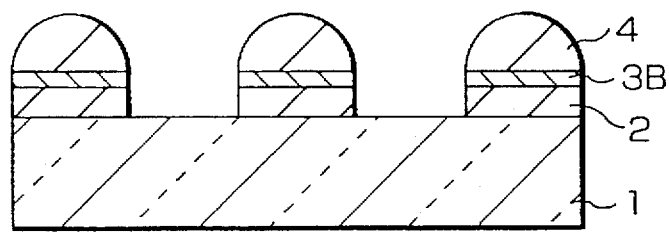

Then, as shown in FIG. 6C, the light shielding layer 2 of ruthenium is etched by oxygen dry etching.

Figure 6D:
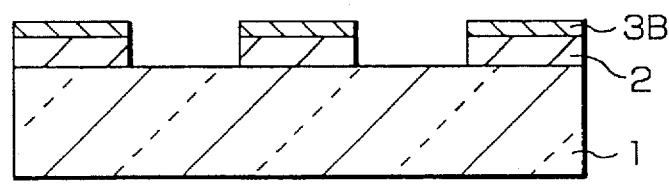

Then, finally, as shown in FIG. 6D, photo mask is completed by removing the photosensitive resin layer 4 by acid washing.

In the third embodiment, since the layer to be etched by the chlorine gas is only the upper reflection preventing layer 3B, the transparent substrate 1 is never damaged. Upon dry etching of the light shielding layer 2 of ruthenium employing oxygen gas, the transparent substrate 1 is never etched. Also, even in this third embodiment, the layer to be etched by the fluorine gas is only thin reflection preventing layer 3B having thickness of 30 nm, and the lower light shielding layer 2 is etched with taking the reflection preventing layer 3B as mask, the mask may achieve higher dimensional precision than that in the prior art, easily.

FIGS. 7A to 7D are sections showing substrate for discussing the fourth embodiment of the present invention.

Figure 7A:
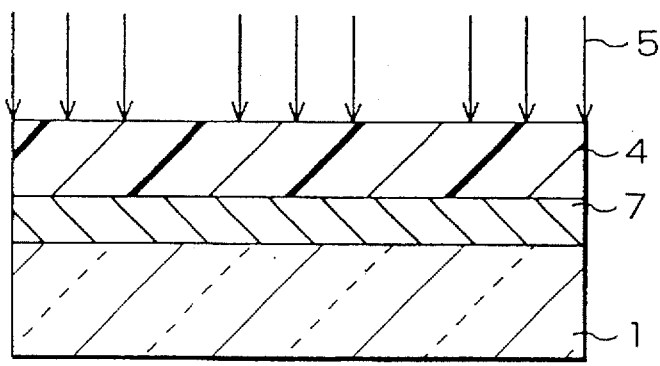
FIGS. 7A to 7D are sections showing a substrate for explaining the fourth embodiment according to the present invention.

At first, as shown in FIG. 7A, sputtering is performed with supplying oxygen and nitrogen gas to deposit a semi-transparent layer 7 of oxi-nitride ruthenium on the transparent substrate 1 of quartz. The thickness of the semi-transparent layer 7 is set at 152 nm, since the optical constant is n=2.2 assuming that mercury i-line (wavelength $\lambda=365$ nm) is used as the exposure light, and the layer thickness t is expressed by $t=\lambda/2(n-1)$. On the other hand, at this time, approximately 5% of transparency is obtained. Next, photosensitive resin layer 4 is applied over the entire surface, the predetermined pattern is written by electron beam lithographic method.

Figure 7B:
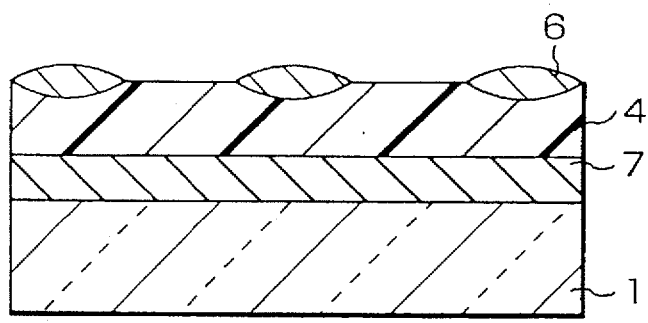
Figure 7C:
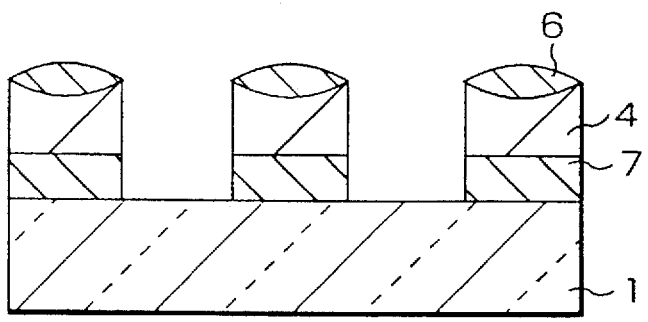

Next, as shown in FIG. 7B, the sililated layer 6 is formed by supplying silicon into the surface of photosensitive resin layer 4 created by a sililation method. Then, as shown in FIG. 7C, the photosensitive resin layer 4 and semi-transparent layer 7 at the non-exposed portion is etched with taking the sililated layer 6 as mask by oxygen dry etching.

Figure 7D:
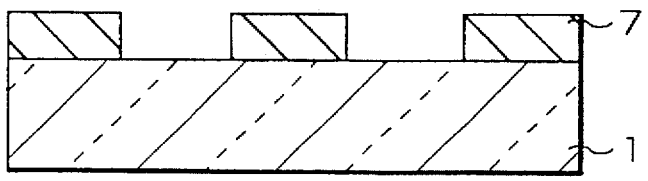

Next, as shown in FIG. 7D, the sililated layer 6 is formed by supplying silicon into the surface of photosensitive resin layer 4 written by sililation method.

Next, as shown in FIG. 7D, the phase shift type photo mask is completed by removing the photosensitive resin layer 4 by acid washing.

Figure 1:
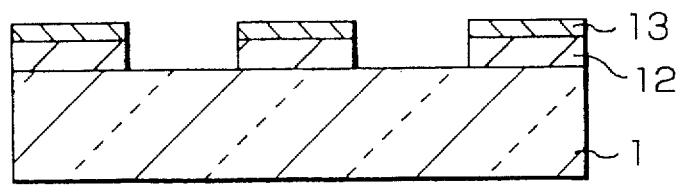
FIG. 1 is a section of the conventional photo mask.
Figure 2:
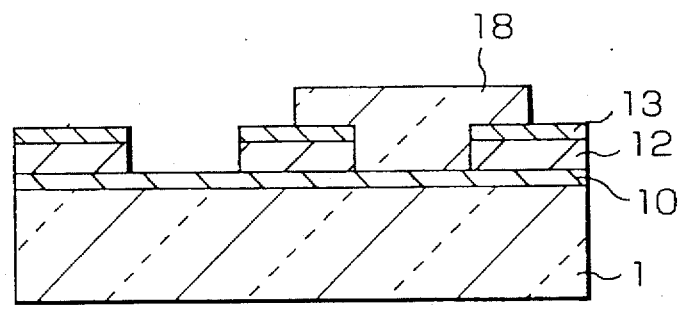
FIG. 2 is a section showing the conventional Shibuya-Levenson phase shift type photo mask.
Figure 3:
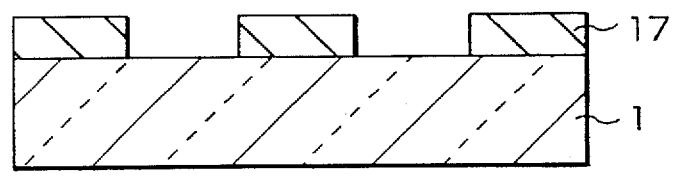
FIG. 3 is a section showing the conventional half-tone phase shift type photo mask.

In the shown fourth embodiment, comparing to the conventional photo mask using oxi-nitride chromium shown in FIG. 3, since the oxi-nitride ruthenium has good conductivity, a problem of charge up during electron beam lithography will never be caused. In case of the oxi-nitride chromium, since it does not have sufficient conductivity, lowering of precision is caused due to charge up during electron beam lithography to require extra measure, such as to employ a conductive layer or so forth, becomes inherent.

The present embodiment has an advantage compared to the conventional half-tone type photo mask utilizing oxi-nitride of a refractory metal silicide as semi-transparent layer. When the oxi-nitride of refractory metal silicide is utilized as the semi-transparent layer, since the material has high conductivity, such problem of charge up has never been arisen. However, as set forth above, when the refractory metal is employed, process is performed by dry etching with the gas containing fluorine, the transparent substrate of quartz is also etched to roughen the surface to cause variation of transparency. In addition, due to thinning of the transparent substrate, phase error (offset from 180° of phase difference) can be caused. On the other hand, in the shown embodiment, since the semi-transparent layer is etched by the gas containing oxygen as primary component, the transparent substrate is never influenced at all. Therefore, it becomes possible to produce the photo mask with no phase error.

Figure 8A:
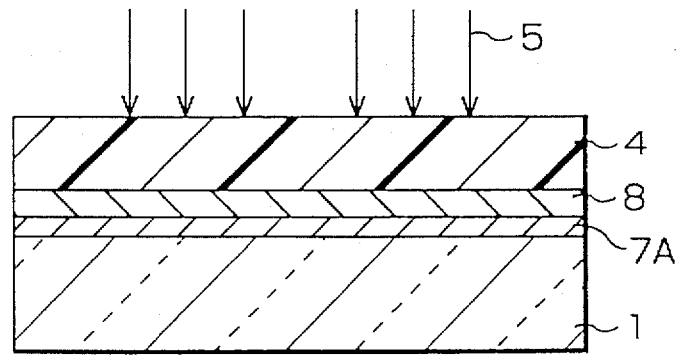
FIGS. 8A to 8D are sections showing a substrate for explaining the fifth embodiment according to the present invention.

FIGS. 8A to 8D are sections of the substrate for explaining the fifth embodiment of the present invention. At first, as shown in FIG. 8A, a semi-transparent layer 7A of ruthenium oxide of 30 nm in thickness is deposited by performing sputtering by supplying oxygen on the transparent substrate 1 of quartz. Subsequently, a transparent layer 8 of silicon nitride of 73 nm in thickness is formed on the semi-transparent layer 7A by CVD method. Assuming that mercury i-line (wavelength $\lambda=365$ nm) is employed as exposure light, the optical constant of the ruthenium oxide is $n=2.1$. On the other hand, the optical constant of the silicon nitride is $n=4.2$, and assuming that the semi-transparent layer of ruthenium oxide is 30 nm in layer thickness, the layer thickness of the silicon nitride to obtain 180° becomes 73 nm. Next, the photosensitive resin layer is applied over the entire surface. Then, the predetermined pattern is written by electron beam lithographic method.

Figure 8B:
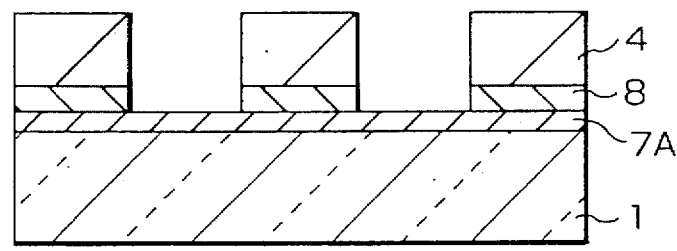

Next, as shown in FIG. 8B, after forming the pattern of the photosensitive resin layer 4 by development, the transparent layer 8 of silicon nitride is etched by dry etching with fluorine gas.

Figure 8C:
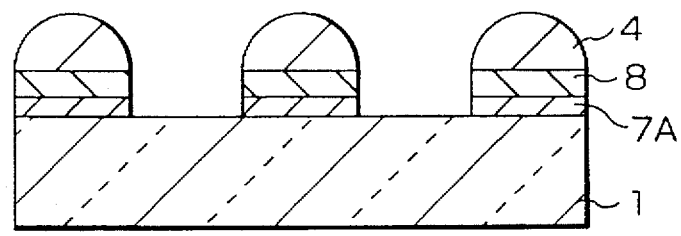

Then, as shown in FIG. 8C, the semi-transparent layer 7A is etched by dry etching employing oxygen.

Figure 8D:
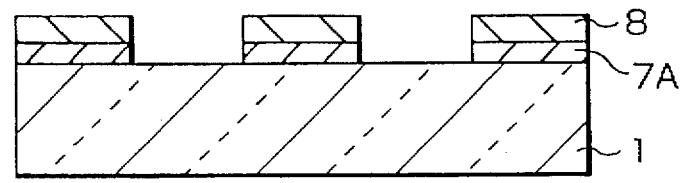

Then, finally, as shown in FIG. 8D, photo mask is completed by removing the photosensitive resin layer 4 by acid washing.

In the foregoing fifth embodiment, since transparent layer 8 and semi-transparent layer 7A are employed, the transparency can be advantageously varied in wide range by varying the thickness of the semi-transparent layer. Even in the shown embodiment, upon etching of the transparent layer, the semi-transparent layer serves as etching stopper to prevent the transparent substrate from being damaged. On the other hand, upon etching of the semi-transparent layer, the transparent layer may serve as etching mask. Thus, half-tone phase shift type photo mask having higher dimensional precision and phase difference precision than the prior art can be obtained similarly to the former embodiment.

It should be noted that similar effect can be obtained even when the ruthenium and ruthenium nitride is employed as the semi-transparent layer, and the silicon oxide is employed as the transparent layer.

Figure 9A:
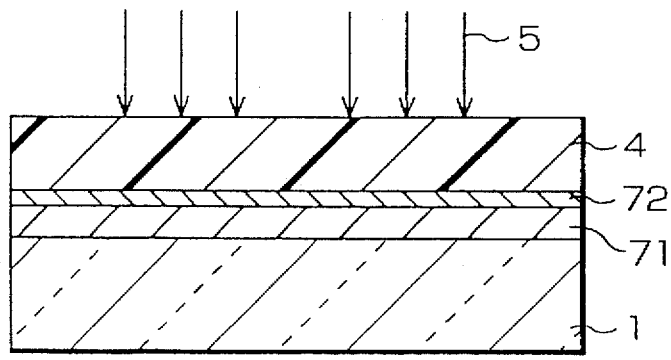
FIGS. 9A to 9D are sections showing a substrate for explaining the sixth embodiment according to the present invention.

FIGS. 9A to 9D are sections of the substrate for discussing the sixth embodiment of the present invention. At first, as shown in FIG. 9A, a first semi-transparent layer 71 of ruthenium oxide in a thickness of 80 nm is deposited on the transparent substrate 1 of quartz, and a second semi-transparent layer 72 of oxi-nitride-chromium in the thickness of 30 nm is deposited thereon. Next, the photosensitive resin layer 4 is applied over the entire surface, and the predetermined pattern is written by electron beam lithographic method.

Figure 9B:
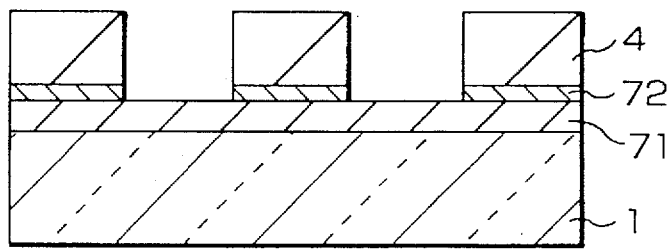

Next, as shown in FIG. 9B, after forming the pattern of the photosensitive resin layer 4 by development, the second semi-transparent layer 72 of the oxi-nitride chromium is etched by dry etching with gas containing chloride.

Figure 9C:
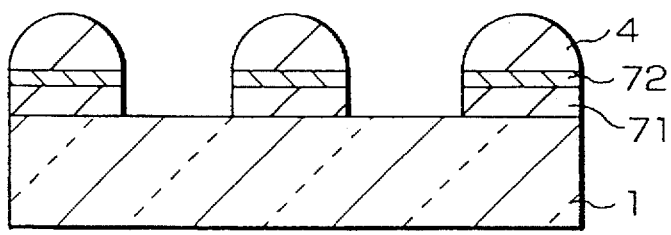

Then, as shown in FIG. 9C, the first semi-transparent layer 71 of ruthenium oxide is etched by oxygen dry etching with taking the second semi-transparent layer 72 of oxi-nitride chromium as mask.

Figure 9D:
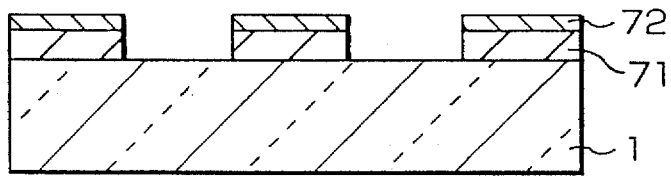

Then, finally, as shown in FIG. 9D, photo mask of phase shift type is completed by removing the photosensitive resin layer 4 by acid washing.

In the sixth embodiment, by setting the transparency within a range of 3 to 15% by the first semi-transparent layer 71 of ruthenium oxide and the second semi-transparent layer 72 of oxi-nitride-chromium to provide a phase shift of 180°. On the other hand, the second transparent layer 72 of oxi-nitride-chromium serves as the reflection preventing layer in addition to setting of the phase and transparency. On the other hand, the layer thickness of the oxi-nitride-chromium to be etched by chloride is thin in the extend of approximately one third of the conventional layer shown in FIG. 3, the dimensional precision of the mask can be improved.

It should be noted that similar effect can be obtained even when the ruthenium and ruthenium nitride is employed as the semi-transparent layer, and the silicon oxide is employed as the transparent layer.

Figure 10A:
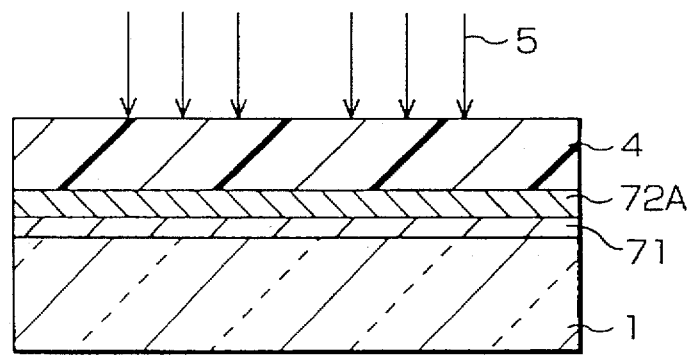
FIGS. 10A to 10D are sections showing a substrate for explaining the seventh embodiment according to the present invention.

FIGS. 10A to 10D are sections of the substrate for discussing the seventh embodiment of the present invention. At first, as shown in FIG. 10A, a first semi-transparent layer 71 of ruthenium oxide in a thickness of 10 nm is deposited on the transparent substrate 1 of quartz, and a second semi-transparent layer 72A of oxi-nitride-molybdenum silicide in the thickness of 140 nm is deposited thereon. Next, the photosensitive resin layer 4 is applied over the entire surface, and the predetermined pattern is written by electron beam lithographic method.

Figure 10B:
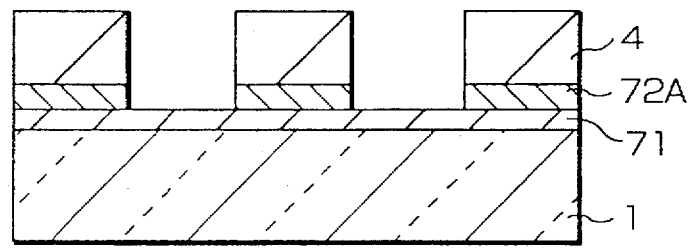

Next, as shown in FIG. 10B, after forming the pattern of the photosensitive resin layer 4 by development, the second semi-transparent layer 72 of the oxi-nitride-molybdenum silicide is etched by dry etching with gas containing fluorine.

Figure 10C:
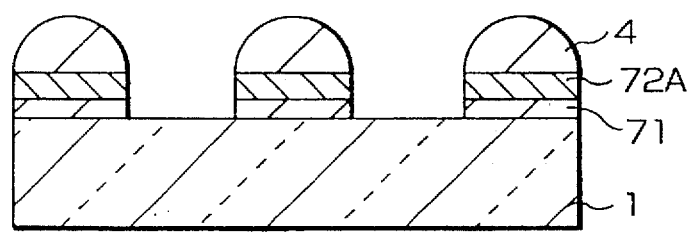

Then, as shown in FIG. 10C, the first semi-transparent layer 71 of ruthenium oxide is etched by oxygen dry etching with taking the second semi-transparent layer 72A of oxi-nitride-molybdenum silicide as mask.

Figure 10D:
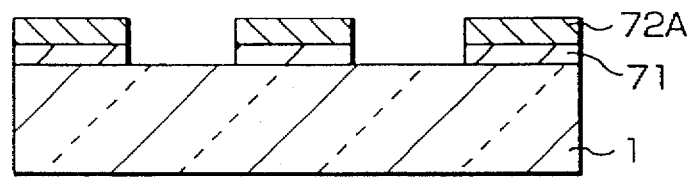

Then, finally, as shown in FIG. 10D, photo mask is completed by removing the photosensitive resin layer 4 by acid washing.

In the shown embodiment, by setting the transparency within a range of 3 to 15% by the first semi-transparent layer 71 of ruthenium oxide and the second semi-transparent layer 72 of oxi-nitride-molybdenum silicide to provide a phase shift of 180°. On the other hand, the first semi-transparent layer of ruthenium oxide serves as etching stopper upon etching with fluorine gas, the transparent substrate 1 can be prevented from being damaged. Therefore, the half-tone phase shift type photo mask with smaller error in phase can be fabricated. Similar effect can be obtained by employing ruthenium and ruthenium nitride as the semi-transparent layer.

It should be noted that while the foregoing embodiments have been discussed with respect to the case where the electron beam lithographic system is employed in writing the pattern on the resin layer, the method of writing the pattern is not limited to the electron beam, but other lithographic method of ultra violet light beam to be employed in fabrication of photo mask is equally applicable. For example, substantially equivalent effect can be employed by employing a laser lithographic system (Ar laser: wavelength 364.8 nm), such as CORE-2564 from. ETEC, or mercury lamp, photosensitive resin for i-line exposure.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A photo mask comprising:

a transparent substrate;

a light shielding layer of ruthenium formed on said transparent substrate; and a reflection preventing layer of ruthenium oxide formed on said light shielding layer.

2. The photo mask of claim 1, wherein the photo mask is a transmission mask in which light is projected through said transparent substrate and blocked by said light shielding layer so as to create a predetermined pattern of light for forming an integrated circuit on a semiconductor wafer.

3. The photo mask of claim 1, wherein said light shielding layer of ruthenium is selectively formed as a pattern on said transparent substrate and said reflection preventing layer is formed on, and is coincident with, the selectively formed pattern of said shielding layer.

4. A fabrication process of a photo mask comprising the steps of:

forming a mask blank by sequentially forming a light shielding layer of ruthenium and a reflection preventing layer of ruthenium oxide on a transparent substrate;

forming a sililated layer by applying a photosensitive resin on said mask blank and performing sililation process after electron beam or ultra violet beam lithography; and performing etching of said photosensitive resin layer, said reflection preventing layer and said light shielding layer by dry etching employing an oxygen gas with taking said sililated layer as a mask.

5. A photo mask comprising:

a transparent substrate;

a light shielding layer of ruthenium formed on said transparent substrate; and a reflection preventing layer of one kind of material selected from a group consisted of chromium oxide, chromium nitride and oxi-nitride-chromium, formed on the light shielding layer.

6. The photo mask of claim 5, wherein the photo mask is a transmission mask in which light is projected through said transparent substrate and blocked by said light shielding layer so as to create a predetermined pattern of light for forming an integrated circuit on a semiconductor wafer.

7. The photo mask of claim 5, wherein said light shielding layer of ruthenium is selectively formed as a pattern on said transparent substrate and said reflection preventing layer is formed on, and is coincident with, the selectively formed pattern of said shielding layer.

8. A fabrication process of a photo mask comprising the steps of:

forming a mask blank by sequentially forming a light shielding layer of ruthenium and a reflection preventing layer of one kind of material selected from a group consisted of chromium oxide, chromium nitride and oxi-nitride-chromium, on a transparent substrate;

applying a photosensitive resin on said mask blank and developing said photosensitive resin after electron beam or ultra violet beam lithography, thereby patterning said photosensitive resin layer; and performing etching of said reflection preventing layer by dry etching employing a gas containing chloride with taking said photosensitive resin layer as a mask and subsequently performing etching of said light shielding layer by dry etching employing an oxygen gas.

9. A photo mask comprising:

a transparent substrate;

a light shielding layer of ruthenium formed on said transparent substrate; and a reflection preventing layer of one kind of material selected from a group consisted of oxide, nitride and oxi-nitride of refractory metal silicide, formed on said light shielding layer.

10. The photo mask of claim 9, wherein the photo mask is a transmission mask in which light is projected through said transparent substrate and blocked by said light shielding layer so as to create a predetermined pattern of light for forming an integrated circuit on a semiconductor wafer.

11. The photo mask of claim 9, wherein said light shielding layer of ruthenium is selectively formed as a pattern on said transparent substrate and said reflection preventing layer is formed on, and is coincident with, the selectively formed pattern of said shielding layer.

12. A fabrication process of a photo mask comprising the steps of:

forming a mask blank by sequentially forming a light shielding layer of ruthenium and a reflection preventing layer of one kind of material selected from a group consisted of oxide, nitride and oxi-nitride of refractory metal silicide on a transparent substrate;

applying a photosensitive resin on said mask blank and developing said photosensitive resin layer after electron beam or ultra violet beam lithography, thereby patterning said photosensitive resin layer; and performing etching of said reflection preventing layer by dry etching employing a gas containing fluorine with taking said photosensitive resin layer as a mask and subsequently performing etching of said light shielding layer by dry etching employing an oxygen gas.

13. A half-tone photo mask comprising:

a transparent substrate; and a semi-transparent layer of at least one kind of material selected from a group consisted of ruthenium, ruthenium oxide, ruthenium nitride and oxi-nitride-ruthenium, formed on said transparent substrate, so that light phases between an exposure light passing through said semi-transparent layer and an exposure light not passing through said semi-transparent layer are shifted 180°.

14. The photo mask of claim 13, wherein the photo mask is a transmission mask in which light is projected through said transparent substrate at a first phase and projected through said semi-transparent layer converting the light to a second phase, shifted 180° from said first phase, so as to create a predetermined pattern of light for forming an integrated circuit on a semiconductor wafer.

15. The photo mask of claim 13, wherein said semi-transparent layer is selectively formed as a pattern on said transparent substrate.

16. A fabrication process of a photo mask on a transparent substrate comprising the steps of:

forming a mask blank formed of a semi-transparent layer formed of at least one kind of material selected from a group consisted of ruthenium, ruthenium oxide, ruthenium nitride and oxi-nitride-ruthenium;

forming a sililated layer by applying a photosensitive resin on said mask blank and performing sililation process after electron beam or ultra violet beam lithography; and performing etching of said photosensitive layer and said reflection preventing layer by dry etching employing an oxygen gas with taking said sililated layer as a mask.

17. A half-tone photo mask comprising:

a transparent substrate; and a stacked layer consisted of a semi-transparent layer formed of at least one kind of material selected from a group consisted of ruthenium, ruthenium oxide, ruthenium nitride and oxi-nitride-ruthenium, and a transparent layer of one kind of material selected from a group consisted of silicon oxide, a silicon nitride and oxi-nitride-silicon;

a transparent region being patterned in said transparent substrate defined by said semi-transparent region, so that light phases between a light passing through said transparent region and a light passing through said semi-transparent region are shifted 180°.

18. The photo mask of claim 17, wherein the photo mask is a transmission mask in which light is projected through said transparent substrate at a first phase and projected through said semi-transparent layer and said transparent layer converting the light to a second phase, shifted 180° from said first phase, so as to create a predetermined pattern of light for forming an integrated circuit on a semiconductor wafer.

19. The photo mask of claim 17, wherein said semi-transparent layer including ruthenium is selectively formed as a pattern on said transparent substrate and said transparent layer is formed on, and is coincident with, the selectively formed pattern of said semi-transparent layer.

20. A fabrication process of half-tone photo mask comprising the steps of:

forming a semi-transparent layer formed of at least one kind of material selected from a group consisted of ruthenium, ruthenium oxide, ruthenium nitride and oxi-nitride-ruthenium, on a transparent substrate;

forming a mask blank formed of a transparent layer of one kind of material selected from a group consisted of silicon oxide, a silicon nitride and oxi-nitride-silicon, on said semi-transparent layer;

patterning a photosensitive resin layer by applying said photosensitive resin on said mask blank, and performing electron beam or ultraviolet beam lithography and development on said photosensitive resin;

performing dry etching of said transparent layer employing a fluorine gas with taking said photosensitive resin layer as a mask and performing dry etching of said semi-transparent layer employing an oxygen gas.

21. A half-tone photo mask comprising a transparent substrate; and a semi-transparent region having a first semi-transparent layer of material selected from a group consisted of ruthenium, ruthenium oxide, ruthenium nitride and oxi-nitride-ruthenium, and a second semi-transparent layer of any one material selected from a group consisted of chromium oxide, chromium nitride and oxi-nitride-chromium formed on said first semi-transparent layer, a transparent region being patterned in said transparent substrate defined by said semi-transparent region, so that light phases between a light passing through said transparent region and a light passing through said semi-transparent region are shifted 180°.

22. The photo mask of claim 21, wherein the photo mask is a transmission mask in which light is projected through said transparent substrate at a first phase and projected through said semi-transparent region converting the light to a second phase, shifted 180° from said first phase, so as to create a predetermined pattern of light for forming an integrated circuit on a semiconductor wafer.

23. The photo mask of claim 21, wherein said first semi-transparent layer including ruthenium is selectively formed as a pattern on said transparent substrate and said second semi-transparent layer is formed on, and is coincident with, the selectively formed pattern of said first semi-transparent layer.

24. A fabrication process of a half-tone photo mask comprising the steps of:

forming a mask blank by forming a first semi-transparent layer of material selected from a group consisted of ruthenium, ruthenium oxide, ruthenium nitride and oxi-nitride-ruthenium, and a second semi-transparent layer of any one material selected from a group consisted of chromium oxide, chromium nitride and oxi-nitride-chromium, on a transparent substrate, patterning a photosensitive resin layer by applying said photosensitive resin layer on said mask blank and performing electron beam on ultraviolet beam lithography and development on said photosensitive resin layer;

performing dry etching of said second semi-transparent layer employing a gas containing chloride with taking said photosensitive resin layer as a mask and performing dry etching of said first semi-transparent layer employing an oxygen gas.

25. A photo mask comprising a transparent substrate;

a semi-transparent region having a first semi-transparent layer of material selected from a group consisted of ruthenium, ruthenium oxide, ruthenium nitride and oxi-nitride-ruthenium, and a second semi-transparent layer of any one material selected from a group consisted of oxide, nitride and oxi-nitride of refractory metal silicide, a transparent region being patterned in said transparent substrate defined by said semi-transparent region, so that light phases between a light passing through said transparent region and light passing through said semi-transparent region are shifted 180°.

26. The photo mask of claim 25, wherein the photo mask is a transmission mask in which light is projected through said transparent substrate at a first phase and projected through said semi-transparent region converting the light to a second phase, shifted 180° from said first phase, so as to create a predetermined pattern of light for forming an integrated circuit on a semiconductor wafer.

27. The photo mask of claim 25, wherein said first semi-transparent layer including ruthenium is selectively formed as a pattern on said transparent substrate and said second semi-transparent layer is formed on, and is coincident with, the selectively formed pattern of said first semi-transparent layer.

28. A fabrication process of a photo mask comprising the steps of:

forming a mask blank by forming a first semi-transparent layer of material selected from a group consisted of ruthenium, ruthenium oxide, ruthenium nitride and oxi-nitride-ruthenium, and a second semi-transparent layer of any one selected from a group consisted of oxide, nitride and oxi-nitride of refractory metal silicide, patterning a photosensitive resin layer by applying said photosensitive resin layer on said mask blank and performing electron beam or ultraviolet beam lithography and development on said photosensitive resin layer;

performing dry etching of said second semi-transparent layer employing a gas containing fluorine with taking said photosensitive resin layer as a mask and performing dry etching of said first semi-transparent layer employing an oxygen gas.

29. A fabrication process of a photo mask comprising the steps of:

forming a mask blank by sequentially forming a first layer and a second layer on a transparent substrate, said first layer including at least ruthenium; and selectively etching said mask blank, including etching said first layer by dry etching with an oxygen gas, so as to form a predetermined pattern on said transparent substrate without etching said transparent substrate.

30. A fabrication process according to claim 29, wherein said first layer is a light shielding layer and said second layer is a reflection preventing layer.

31. A fabrication process according to claim 29, wherein said first layer is a semi-transparent layer and said second layer is a transparent layer.

32. A fabrication process according to claim 29, wherein said first layer is a first semi-transparent layer and said second layer is a second semi-transparent layer.

33. A fabrication process of a photo mask comprising the steps of:

forming a mask blank by forming an oxi-nitride ruthenium layer on a transparent substrate; and selectively etching said mask blank by dry etching with an oxygen gas, so as to form a predetermined pattern on said transparent substrate without etching said transparent substrate.

* * * * *